Figure 1:
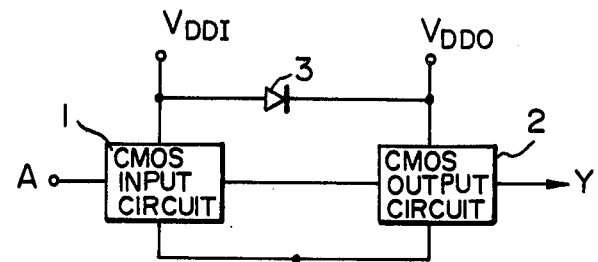

United States Patent [19]

Demetriou

[11] 4,441,035

[45] Apr. 3, 1984

[54] CMOS TURN-ON CIRCUIT

[75] Inventor: Andreas Demetriou, Carp, Canada

[73] Assignee: Mitel Corporation, Ontario, Canada

[21] Appl. No.: 308,414

[22] Filed: Oct. 5, 1981

[30] Foreign Application Priority Data

Jul. 17, 1981 [CA] Canada .................................. 381955

[51] Int. Cl.³ .................... H03K 17/08; H03K 17/22; H03K 17/284
[52] U.S. Cl. ................. 307/200 B; 307/594; 307/451; 307/475
[58] Field of Search ........... 307/451, 475, 469, 200 B, 307/304, 585, 238.3, 594

[56] References Cited

U.S. PATENT DOCUMENTS

| Re. 27,972 | 4/1974 | Borrer et al. | 307/200 B |
|---|---|---|---|
| 3,842,411 | 10/1974 | Naito | 307/585 |
| 3,895,239 | 7/1975 | Alaspa | 307/594 |
| 4,057,844 | 11/1977 | Smedley | 307/200 B |
| 4,353,105 | 10/1982 | Black | 307/200 B |
| 4,366,560 | 12/1982 | McDermott et al. | 307/200 B |

Primary Examiner—John S. Heyman
Attorney, Agent, or Firm—Laff, Whitesel, Conte & Saret

[57] ABSTRACT

A CMOS integrated circuit which requires a higher and a lower supply voltage source, often includes a parasitic diode commonly in the form of a thyristor which is formed with its anode connected to the lower voltage supply terminal and its cathode to the higher voltage supply terminal. The present invention is an FET which has its source-drain circuit connected between the lower voltage terminal of the integrated circuit and the lower voltage source, and its gate to the higher voltage source. This protects the integrated circuit diode from fusing if either passive or dynamic conditions result in the faster voltage rise at the anode relative to the cathode when supply voltage is applied to the integrated circuit, since the voltage at the anode is protected from rising faster than the cathode.

7 Claims, 3 Drawing Figures

CMOS TURN-ON CIRCUIT

This invention relates to CMOS circuits and particularly to means for safeguarding such circuits from failure due to fusing caused by parasitic diodes upon the application of power. CMOS is defined as a combination of N-channel and P-channel MOS transistors (NMOS and PMOS) fabricated on adjacent regions of substrate.

Many CMOS circuits require the application of more than one supply voltage. For example, a typical level shifter requires both a 5 volt and 15 volt power supply voltage, with reference to ground. In the fabrication of such circuits, the inadvertent formation of parasitic diodes, particularly in the form of thyristors, is often unavoidable.

Where the CMOS circuit is divided into an input portion and an output portion, the output portion is normally connected to a more positive supply voltage than the input portion, and the parasitic diode (or diodes) has its anode connected to the less positive voltage supply terminal.

When the power supplies are applied to such circuits, if the voltage which is connected first happens to be applied to the anode of the parasitic diode, the diode will fuse (blow out), thus damaging the CMOS circuit.

U.S. Pat. No. 4,209,713 issued June 24, 1980 to Tokyo Shibaura Electric Co. Ltd. describes a circuit for eliminating the effects of conduction in the thyristor form of such parasitic diodes. A noise absorption means, typically in the form of a resistor, is connected between a source electrode of the CMOS circuit and the positive terminal of an external power source.

However, in a CMOS integrated circuit, resistors of appropriate values are difficult to fabricate, and therefore are costly. In addition, resistors restrict the full power supply voltage from being applied to the CMOS devices in the circuit. The present circuit provides means for absolutely ensuring that the voltage which is applied to the anode of the diode is applied only after the more positive voltage is applied to the cathode of the diode, and therefore for ensuring that the circuit remains safe from fusing in the aforenoted manner. Resistors are not required.

In general, the invention is, in a CMOS integrated circuit requiring a more positive voltage supply and a less positive voltage supply with respect to ground to be applied to corresponding supply terminals, and having at least one parasitic diode with an anode connected in a circuit path to the less positive supply terminal and a cathode connected in a circuit path to the more positive supply terminal, a conductive path for connecting the more positive voltage supply terminal to the circuit, a field effect transistor having one of its source or drain connected to the less positive voltage supply terminal and the other of its source or drain connected to the integrated circuit, and its gate connected to the higher voltage supply terminal.

More generally, the invention is a CMOS integrated circuit requiring two different voltage supplies, means for applying the higher voltage supply to the circuit, and switch means enabled by the application of the higher voltage supply for connecting the lower voltage supply to the circuit.

More particularly, the invention is a CMOS integrated circuit having an input portion requiring a lower voltage supply to be connected to an input portion power supply terminal and an output portion requiring a higher voltage supply to be connected to an output portion power supply terminal, and having parasitic thyristor means with an anode connected in a circuit path to the input portion supply terminal and a cathode connected in a circuit path to the output portion supply terminal, a conductive path for applying a higher voltage power supply to the output portion supply terminal, and MOS switch means enabled by the application of the higher voltage supply for connecting the lower voltage supply to the input portion supply terminal.

It should be noted that the term parasitic diode is intended to include all solid state parasitic structures which exhibit unidirectinal conduction, and the term is intended to include parasitic thyristors.

it should also be noted that by the terms "two different voltage supplies" or "a higher voltage supply and a lower voltage supply" are meant either two different voltages supplied from two distinct power sources or two different potential levels with respect to ground or common derived from a single power source, e.g. as from a passive resistor voltage divider, from a dynamically divided source such as different capacitors charging at different rates, etc.

Figure 2:
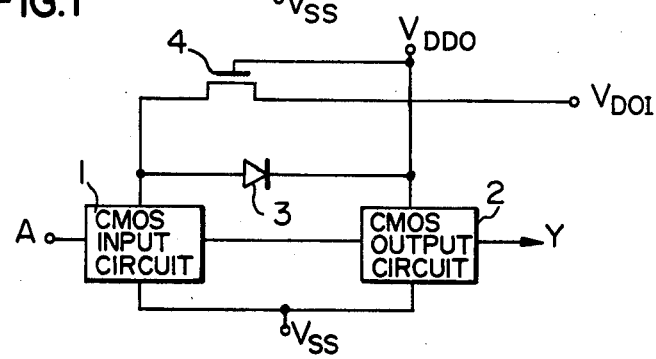
Figure 3:
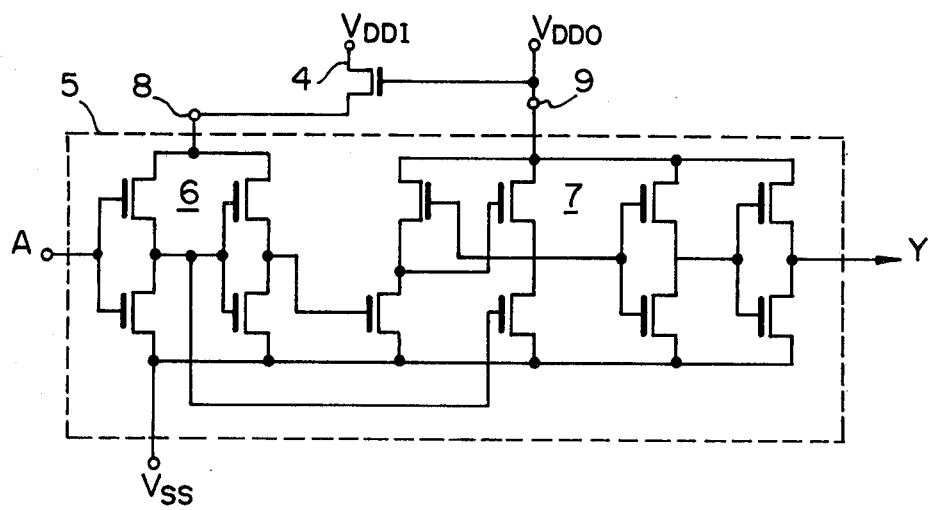

A better understanding of the invention will be obtained by reference to the detailed description below, and to the following drawings, in which:

FIG. 1 is a block diagram of a circuit exhibiting the problem solved by the present invention, FIG. 2 is a block diagram illustrating the invention, and FIG. 3 is a schematic of a CMOS circuit utilizing the invention.

A typical CMOS circuit, such as a level circuit, is shown comprised of an input circuit 1 and an output circuit 2. An input terminal A is connected to the input circuit 1, and an output lead Y is connected to the output circuit 2. Supply voltages $V_{DDI}$, typically +5 volts, and $V_{DDO}$, typically +15 volts, are connected respectively to the input and output circuits 1 and 2. The negative or ground terminal $V_{SS}$ is connected to both input and output circuits.

During manufacture of such circuits, a parasitic diode 3 is usually formed, with its anode connected to the input circuit supply terminal, and its cathode connected to the output circuit supply terminal.

When power is applied to the combined CMOS circuit, both supply voltages are turned on simultaneously. Under normal circumstances, the supply $V_{DDO}$ is more positive than the supply $V_{DDI}$, thus reverse biasing diode 3, and the diode is effectively out of the circuit.

However, sometimes supply voltage $V_{DDI}$ rises more positively faster than $V_{DDO}$, or in fact is switched on a finite time before $V_{DDO}$, which could occur in a race condition. Under this circumstance, the diode 3 becomes at least temporarily forward biased, conducts current heavily, and "blows", i.e. open circuits due to fusing, or generates a latchup condition. The resulting heat and transient currents generated often damages or destroys the CMOS integrated circuit.

FIG. 2 shows the circuit of FIG. 1, modified according to the present invention. The power source which would be connected to the anode of the parasitic diode 3 is connected via the source-drain circuit of a NMOS field effect transistor 4 to the supply terminal of the input circuit. FET 4 can be the NMOS portion of a CMOS. The gate of the NMOS field effect transistor 4 is connected to the more positive (higher) voltage supply terminal which is connected to the cathode of diode 3. As a result the field effect transistor 4 operates as a switch.

In use, both of the supplies $V_{DDI}$ and $V_{DDO}$ are applied in the normal way to the integrated circuit. However since the FET switch 4 has its source-drain circuit open circuited until the gate is enabled, only after application of the $V_{DDO}$ is the FET enabled, and after it is enabled, the $V_{DDI}$ is conducted through to the input circuit 1, and thus to the anode of diode 3. Consequently the circuit is protected from the condition in which diode 3 would blow. Should $V_{DDO}$ become less positive than $V_{DDI}$, the FET switches off, thus protecting the circuit from the anode of the parasitic diode 3 becoming more positive than its cathode.

It should be noted that while the NMOS FET 4 has been shown, which is preferably integrated into the chip containing the remainder of the CMOS circuits, it is the function of FET 4 as a switch which is intended to be used. Consequently as the state of the art advances, or in other environments, other forms of such switches could be used in place thereof.

FIG. 3 shows a typical CMOS level shifter circuit 5, of well known construction. The circuit contains an input portion 6 connected to an output portion 7. A supply voltage $V_{DDI}$ is to be connected to an input portion supply terminal 8 and a more positive supply voltage $V_{DDO}$ is connected to an output portion supply terminal 9.

According to the invention, a NMOS FET 4 has its source-drain circuit (with polarity to suit the form of circuit) connected between the input supply terminal 8 and source $V_{DDI}$. The gate of the FET 4 is connected to the source $V_{DDO}$.

With the application of both sources $V_{DDI}$ and $V_{DDO}$ in any sequence to the integrated circuit, once $V_{DDO}$ is applied, FET 4 is enabled. The source $V_{DDI}$ is only then conducted through to input supply terminal 8, but clearly not before source $V_{DDO}$ has been applied. In a race condition, FET 4 will turn on only when $V_{DDO}$ is more positive than $V_{DDI}$ by the gate threshold of FET 4. Consequently $V_{DDO}$ will always be at a higher voltage than the voltage at terminal 8. If $V_{DDI}$ is higher than $V_{DDO}$ minus the gate threshold, FET 4 switches off.

All parasitic diodes, including parasitic thyristors, which normally have their anodes connected in a circuit to input supply terminal 8 and their cathodes connected to input supply terminal 9 can never be forward biased by the described mechanism, and the circuit is thus protected.

A person understanding the principles of this invention may now conceive of other embodiments or alternatives. All are considered within the sphere and scope of the invention as defined in the claims as appended hereto.

The embodiments of the invention in which an exclusive property or privilege is claimed are defined as follows:

1. The combination of a CMOS integrated circuit requiring two different D.C. voltage supplies of similar polarity for simultaneous application to said circuit, means for connecting a higher voltage terminal of said two voltage supplies to said circuit, a field effect transistor having one of its source or drain connected to a lower voltage supply terminal and the other of its source or drain connected to said circuit, and its gate connected to the higher voltage supply terminal whereby during approximately simultaneous application of said supplies to said circuit, the lower voltage supply is not connected to said circuit until after the higher voltage supply is connected to said circuit.

2. The combination of a CMOS integrated circuit requiring two different D.C. voltage supplies of similar polarity for simultaneous application to said circuit, means for applying the higher voltage supply to said circuit, and switch means enabled by the application of the higher voltage supply for connecting the lower voltage supply to said circuit whereby during approximately simultaneous application of said supplies to said circuit, the lower voltage supply is not connected to said circuit until after the higher voltage supply is connected to said circuit.

3. The combination of a CMOS integrated circuit requiring both a higher D.C. voltage supply and a lower voltage supply to be applied to corresponding supply terminals of said circuit to power operation thereof, having parasitic diode means with an anode connected in a circuit path to said lower voltage supply terminal and a cathode connected in a circuit path to said higher voltage supply terminal, means for connecting a higher voltage D.C. supply to said higher voltage supply terminal, an NMOS field effect transistor in said integrated circuit including means for connecting one of its source or drain to a lower voltage D.C. supply and the other of its source or drain connected to said lower voltage supply terminal of said circuit, and its gate connected to said higher voltage supply whereby during approximately simultaneous application of said supplies to said circuit, the lower voltage supply is not connected to said circuit until after the higher voltage supply is connected to said circuit.

4. In a CMOS integrated circuit requiring a higher voltage D.C. supply and a lower voltage D.C. supply of the same polarity to be applied to corresponding supply terminals of said circuit having parasitic diode means including an anode connected in a circuit path to said lower voltage supply terminal and a cathode connected in a circuit path to said higher voltage supply terminal, MOS switch means enabled by the application of the higher voltage supply to said higher voltage supply terminal for connecting the lower voltage supply to said lower voltage supply terminal whereby during approximately simultaneous application of said supplies to said circuit, the lower voltage supply is not connected to said lower voltage supply terminal until after the higher voltage supply is connected to said higher voltage supply terminal.

5. A CMOS integrated circuit requiring higher and a lower voltage D.C. supplies to be connected to corresponding higher and lower voltage supply terminals respectively of said circuit for powering said circuit and having parasitic diode means with an anode connected in a circuit path to the lower voltage supply terminal and a cathode connected in a circuit path to the higher voltage supply terminal, means for applying the higher voltage D.C. supply to the higher voltage supply terminal, switch means enabled by the application of the higher voltage D.C. supply to said circuit for connecting the lower voltage supply to said circuit whereby during approximately simultaneous application of said supplies to said circuit, the lower voltage supply is not connected to said lower voltage supply terminal until after the higher voltage supply is connected to said higher voltage supply terminal.

6. A CMOS integrated circuit having an input portion requiring a less positive D.C. power supply source to be connected to an input portion power supply terminal and an output portion requiring a more positive D.C. power supply source to be connected to an output portion power supply terminal, and having parasitic thyristor means with an anode connected in a circuit path to the input power supply terminal and a cathode connected in a circuit path to the output power supply terminal, means for applying the more positive supply source to the output portion supply terminal, and a MOS switch means enabled by the application of the more positive supply source for connecting the less positive supply source to the input portion supply terminal whereby during approximately simultaneous application of said supplies to said circuit, the lower voltage supply is not connected to said circuit until after the higher voltage supply is connected to said circuit.

7. A CMOS integrated circuit as defined in claim 6, in which the MOS switch means is comprised of a field effect transistor having its source-drain circuit connected between the input supply terminal and the less positive supply.

* * * * *